US009448281B2

(12) United States Patent
Chien et al.

(10) Patent No.: US 9,448,281 B2
(45) Date of Patent: Sep. 20, 2016

(54) IN SITU ON THE FLY ON-CHIP VARIATION MEASUREMENT

(71) Applicant: Taiwan Semiconductor Manufacturing Co., Ltd., Hsin-Chu (TW)

(72) Inventors: Jinn-Yeh Chien, Chu Bei (TW); Yung-Chow Peng, Hsinchu (TW); Chung-Chieh Yang, Zhubei (TW); Kuan-Yu Lin, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 210 days.

(21) Appl. No.: 14/134,259

(22) Filed: Dec. 19, 2013

(65) Prior Publication Data

US 2015/0177327 A1    Jun. 25, 2015

(51) Int. Cl.
  *G01R 31/28* (2006.01)
  *G01R 31/317* (2006.01)
(52) U.S. Cl.
  CPC ... *G01R 31/31727* (2013.01); *G01R 31/31718* (2013.01); *G01R 31/31725* (2013.01)
(58) Field of Classification Search
  CPC .......... G01R 31/31727; G01R 31/31718; G01R 31/31725
  See application file for complete search history.

(56) References Cited

U.S. PATENT DOCUMENTS

| 8,224,604 | B1* | 7/2012 | Amrutur | G01R 31/3016 327/153 |
| 8,664,978 | B2* | 3/2014 | Lu | H03K 5/135 324/762.01 |
| 2006/0242474 | A1* | 10/2006 | Jun | H03K 5/133 714/700 |
| 2012/0081141 | A1* | 4/2012 | Jenkins | G01R 31/31725 324/762.01 |
| 2012/0212238 | A1* | 8/2012 | Balakrishnan | G01R 31/2882 324/617 |
| 2013/0049810 | A1 | 2/2013 | Lu et al. | |

* cited by examiner

*Primary Examiner* — Sam Rizk
(74) *Attorney, Agent, or Firm* — Eschweiler & Associates, LLC

(57) ABSTRACT

A methodology and circuits for integrated circuit design are provided. A first electronic design file for an integrated circuit is provided. The first electronic design file for the integrated circuit has a timing measurement circuit thereon. Based on the first electronic design file, a number of integrated circuits are manufactured. These manufactured integrated circuits have respective timing measurement circuits arranged at predetermined locations thereon. The timing measurement circuits are used to measure a number of respective timing delay values, which are subject to manufacturing variation, on the integrated circuits. The measured timing delay values are used to set how an auto-place and route tool arranges blocks in a second electronic design file, which is routed after the timing delay values are measured, to account for any measured manufacturing variation.

20 Claims, 3 Drawing Sheets

IN SITU ON THE FLY ON-CHIP VARIATION MEASUREMENT

BACKGROUND

An integrated circuit (also referred to as an IC, a chip, or a microchip) is a set of electronic circuits on a small piece of semiconductor material, normally silicon. ICs are used in virtually all electronic equipment today and have revolutionized the world of electronics. Computers, mobile phones, and other digital home appliances have been made possible by the low cost of ICs and are now inextricable parts of the structure of modern societies. ICs can be made very compact, for example, having up to several billion transistors and other electronic components in an area the size of a fingernail.

Due to the complexities involved in manufacturing ICs, it is important to test these ICs for functional defects prior to distributing them to customers. Testing can be performed by a piece of test equipment called a probe station, which presses tiny probes onto pads on the individual ICs. Once these probes are pressed onto the IC pads, input test vectors (e.g., a series of "1"s and "0"s for a digital IC) are applied to the IC. Based on these input test vectors, the circuitry on the IC outputs digital output values (i.e., test results). If the measured test results are the same as predetermined expected test results, which were set based on the underlying IC design as envisioned by designers, then the chip is deemed to meet design specifications. On the other hand, if the measured test results do not correspond to the expected test results, then the chip is a failure. Chips can be "binned" in some cases where failures are not necessarily fatal or in other cases where chips perform at higher performance levels than design specifications.

DETAILED DESCRIPTION

Figure 1:
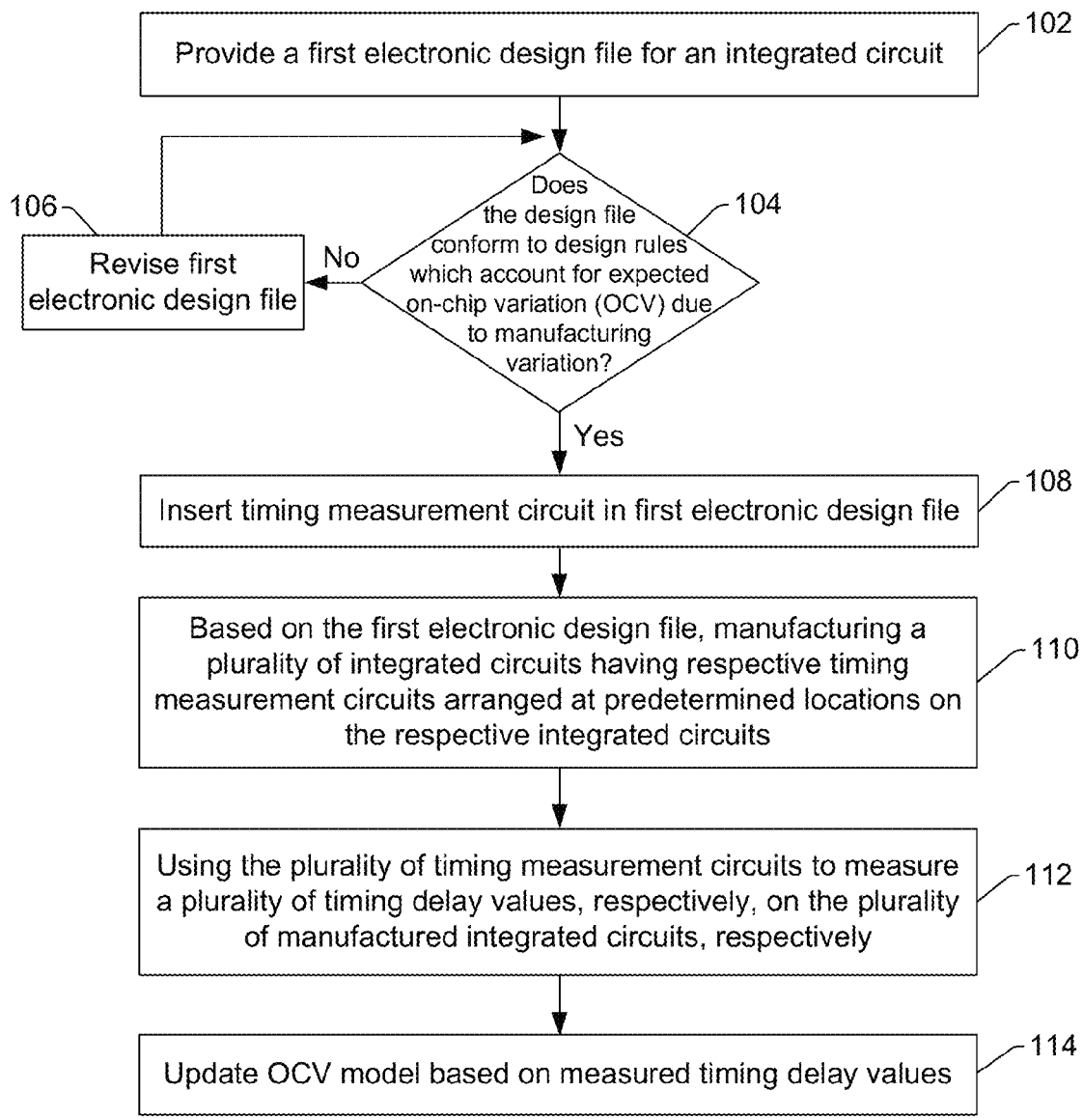
FIG. 1 illustrates a design flow methodology in flow-chart format in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

In conventional testing techniques, predetermined input test vectors or randomized test vectors, each test vector including a series of "1"s and "0"s, are applied to an IC to check the IC's functionality. If logic gates and/or state machines of the IC are functioning according to specified operating conditions, the IC will output actual test results as a series of "1"s and "0"s which match expected test results. Various fault conditions, such as internal nodes that are "stuck at 1" or "stuck at 0", race conditions, or timing paths that are too long, for example, can cause the patterns of "1"s and "0"s of the actual test results to differ from that of the expected test results.

Traditionally, if the actual test results differ from the expected test results, a designer analyzes the underlying IC design to pinpoint the design location where the bit-error or fault occurred in the design, and then possibly alters the electronic version of the design and re-fabricates the IC so it is more robust against such faults. Unfortunately, although this traditional analysis, in which bit-errors found on actual silicon are mapped to fault locations in the underlying IC design, is effective in improving individual designs, this analysis is time-consuming in that faults for each chip are uniquely identified are corrected. Moreover, this analysis does not provide direct insights into how underlying designs can be tuned prior to manufacture to account for random process variation that can occur over a large number of wafers.

As will be appreciated below, the present disclosure sets forth a design flow methodology whereby actual timing measurement circuits are included on the manufactured IC. Rather than merely checking whether binary patterns of output test vectors match with those of expected test vector results, these timing measurement circuits take actual time delay measurements on the silicon IC to characterize process variation experienced by the IC. This may be beneficial in more accurately characterizing how clock loading, clock skew, and the like are affected by random process variation, which was difficult to accurately characterize solely by traditional test vector pattern analysis. After the timing measurement circuits characterize the random on-chip process variation, the measured process variation can then be used to set how an auto-place and route tool arranges standard cells for future IC designs. In this way, this flow can ward off some defects in silicon wafers and help to improve yields over conventional techniques.

FIG. 1 illustrates a method in accordance with some embodiments of the present disclosure. At 102, a first electronic design file, such as a .GDS, .GDSII, or .CIF file, which describes an integrated circuit (IC) is provided. In 104, the method checks the first electronic design file to see if the first electronic design file conforms to design rule checks (DRCs) which account for expected on-chip variations (OCV) due to manufacturing variations. If not (NO at 104), the first electronic design file is iteratively revised in 106 until it passes DRC. Once DRC is passed (YES at 104), at 108 a timing measurement circuit is inserted at a predetermined location in the first electronic design file and the IC can be re-checked for DRC (not shown). At 110, based on the first electronic design file, a number of ICs are manufactured. The ICs have respective timing measurement circuits arranged at pre-determined locations thereon. In 112, the timing measurement circuits measure a number of timing delay values, respectively, on the number of ICs, respectively. In 114, the OCV model used in 104 is updated based on the measured timing delay values. For example, the measured timing delay values can be used to set how an auto-place and route tool arranges standard cells in a second electronic design file which is routed after the timing delays are measured.

By measuring these timing delay values on actual silicon, rather than just analyzing test vector error-patterns to determine fault locations where a design was in-sufficient, the methodology of FIG. 1 provides good insights into actual process variation that is on-going at the fabrication facility. For example, in some situations where a wafer falls within a "slow/slow" process corner but still passes functional tests, conventional test vector analysis may show only "TEST PASSED." By measuring an actual timing delay value for a timing path on this wafer, process engineers can quickly and easily learn the precise operating conditions of the manufactured IC. For example, rather than just determining "TEST PASSED"/"TEST FAILED", the process engineers can measure the actual timing delay value of a predetermined timing path on the IC to better delineate actual functionality of the IC. This measured timing delay value can be provided as a multi-bit digital value, a current value, or a voltage level, for example, as will be described in greater detail below.

Figure 2:
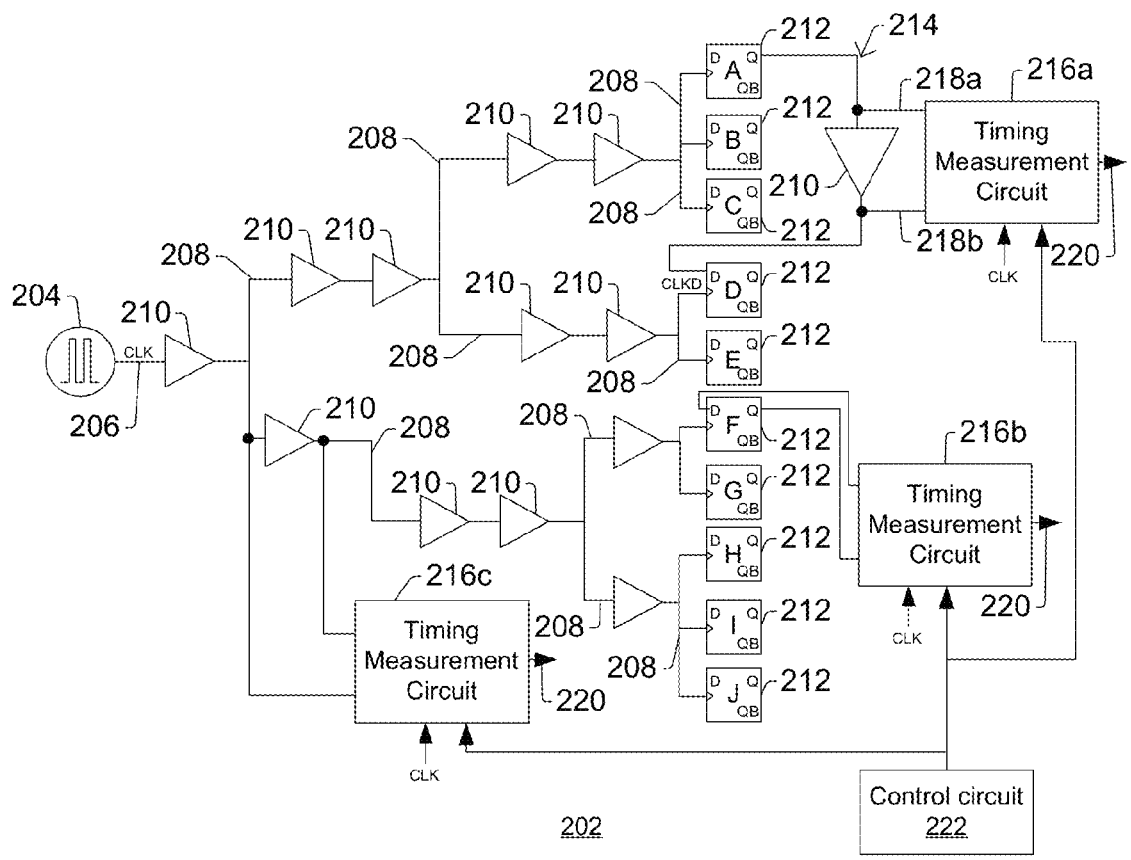
FIG. 2 illustrates an integrated circuit which includes a clock tree and a timing measurement circuit in accordance with some embodiments.

As an example of a particular context in which FIG. 1's design flow is advantageous, FIG. 2 shows an example of a clock tree structure 202 that is arranged on an integrated circuit. The clock tree structure 202 includes a clock source 204 and a clock tree trunk 206. A number of clock tree branches 208 stem from the clock tree trunk 206 and/or stem from other clock tree branches.

Delay elements 210, such as logic gates or clock distribution elements, and data storage elements 212, such as flip-flops, are arranged on the clock tree branches 208. It will be appreciated that FIG. 2 is just an example of a clock tree and although it depicts multiple delay elements 210 with the same icon, different delay elements 210 can differ from one another (e.g., different delay elements can have different circuitry and/or can have different delays). In addition, for purposes of explanation, applicants note that data storage elements A and D are sequentially adjacent to one another in that the output of data storage element A is coupled to the input of data storage element D via timing path 214, which includes one or more delay elements 210 without additional data storage elements there between. Timing measurement circuits 216 and a control circuit 222 are also present. Thus, in general, circuit elements may be connected by signal paths, which are not to be limited to clock tree branches, clock tree trunks, or other clock tree structural elements.

Figure 3:
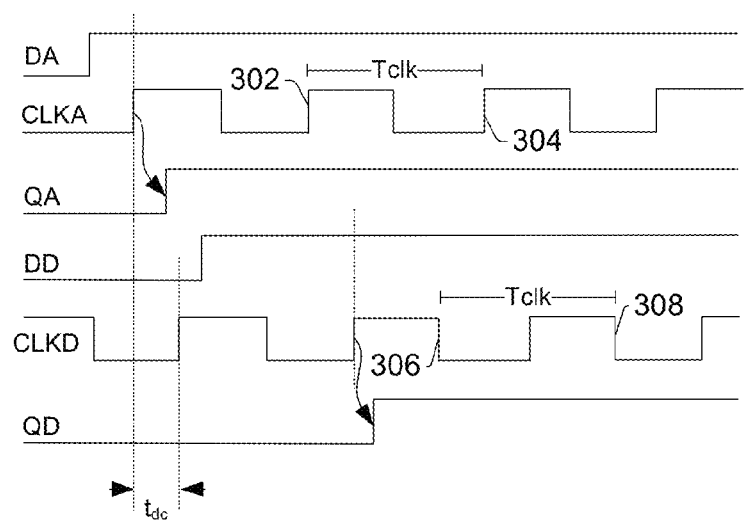
FIG. 3 illustrates an example timing diagram in accordance with some embodiments.

During operation of clock tree 202, the clock source 204 provides a clock signal, which is distributed to the various delay elements 210 and data storage elements 212 and which consists of a series of rising edges and falling edges. As illustrated in FIG. 3's timing diagram, the clock signal has a clock period defined by a time, $T_{clk}$, between adjacent rising edges (e.g., 302, 304) and/or adjacent falling edges (e.g., 306, 308). As this clock signal propagates through the clock tree structure 202, parasitic capacitance and resistance of the clock tree structure can cause clock skew, whereby the clock edges reach circuit elements at slightly different times and/or have waveform shapes that are degraded (e.g., less sharp) for different parts of the IC. For example, FIG. 3's timing diagram shows an example where the clock signal CLKD as received at data storage element D is delayed by time delay, $T_{dc}$, relative to the clock signal CLKA as received at data storage element A. Accordingly, as the clock period, $T_{clk}$, becomes shorter and/or clock skew becomes larger, clock skew can cause setup and/or hold time violations for sequentially adjacent data storage elements. This clock skew can cause the downstream data storage element (e.g., data storage element D in FIG. 2) to "miss" storing a data value presented to it by a sequentially adjacent upstream data storage element (e.g., data storage element A in FIG. 2). In other words, if clock skew becomes too large for sequentially adjacent data storage elements, logical data errors can occur as a result. As these logical data errors propagate through the IC, the end result is that a measured test result for a given test vector may differ from an expected test result but only when the clock skew becomes greater than some threshold value.

To accurately characterize this timing delay, $T_{dc}$, which can be different for different ICs due to manufacturing variation, the IC 200 includes timing measurement circuits 216. Each timing measurement circuit 216 has first and second inputs (e.g., 218a, 218b) over which a timing delay is measured, and also includes a test probe output interface 220, such as a bond pad, solder bump, or other IC pin, by which the timing measurement circuit 216 can provide its measured timing delay value to an external test probe device. Notably, timing measurement circuits 216 do not require the use of special test vectors to measure timing delay, but rather can measure timing delay for any given operating mode when the clock signal is enabled. Thus, timing measurement circuits 216 can evaluate timing delay during a normal operating mode of the device, which is more streamlined than test vector analysis approaches.

Timing measurement circuits 216 can be arranged at a number of different predetermined positions on the IC. In FIG. 2's example, a first timing measurement circuit 216a has its first and second inputs 218a, 218b coupled to opposite ends of timing path 214, which extends between two sequentially adjacent data storage elements A and D and which includes delay element 210. Thus, the first timing measurement circuit 216a can measure the delay between the sequentially adjacent data storage elements, which can be a critical path in the design where expected timing delay is closest to required setup and hold times of data storage elements.

A second timing measurement circuit 216b is arranged so its first and second inputs are coupled to an input and output of a single data storage element F. A third timing measurement circuit 216c is arranged so its first and second inputs are coupled over an asynchronous delay path, such as series of combinatorial logic without any data storage elements included therein. Depending on the implementation, the timing measurement circuit outputs 220 can be coupled to separate pins of the IC and their measured timing delay values can be output in parallel from the IC; or the timing measurement circuit outputs 220 can be coupled to a memory storage element such as a shift register, and can be output from the IC in serial.

The timing measurement circuits 216 can take various forms depending on the implementation. In some embodiments, a timing measurement circuit is a time to digital converter (TDC). Such a TDC provides a multi-bit digital value corresponding to a first timing delay value as measured between the first input and second input of the timing measurement circuit. The multi-bit digital value can vary between a first digital value corresponding to a predetermined maximum timing delay value and a second, different digital value corresponding to a predetermined minimum timing delay value. For example, consider an embodiment where this multi-bit digital value is an 8-bit value capable of representing $2^8$ different timing delay values (i.e., 256 different timing delay values). In cases where the rising edges of a clock are perfectly aligned with zero clock skew (e.g., 0 ns timing delay) for first and second inputs of the timing measurement circuit, the time to digital converter can output an 8-bit value of b'0000_0000. In other cases where the rising edges of the clock are offset by one-half of the clock period (e.g., 500 ps for a 2 GHz clock signal), the time-to-digital converter can output an 8-bit value of b'1000_0000. Thus, for each of 256 different timing delays, a different 8-bit value can describe what timing delay value is measured by the time-to-digital converter. Accordingly, by evaluating one or more such timing delay values for one or more wafers, the speed of the IC (and corresponding process variation experienced by that IC) can be easily evaluated.

In various embodiments, the timing measurement circuits 216 are time to current converters. The time to current converter provides a current level value corresponding to a first timing delay value as measured between the first input and second input, wherein the current level value can vary between a first current level value corresponding to a predetermined maximum timing delay value and a second, different current level value corresponding to a predetermined minimum timing delay value. For example, if the output current level of the time-to-current converter has a total range from 0 mA to 50 mA, an output current level of zero can correspond to zero (or some minimal) clock skew (e.g., 0 ns timing delay); an output current level of 25 mA can correspond to rising edges of the clock being offset by one-half of the clock period (e.g., 500 ps for a 2 GHz clock signal); and so on.

In some implementations, control circuit 222 enables the timing measurement circuits 216 so they can measure timing delay during a test mode when the clock source is enabled. The control circuit 222 can also disable the timing measurement circuits 216 during a low-power mode. In this way, the timing measurement circuits 216 will not needlessly consume power during low power operation of the IC.

Figure 4:
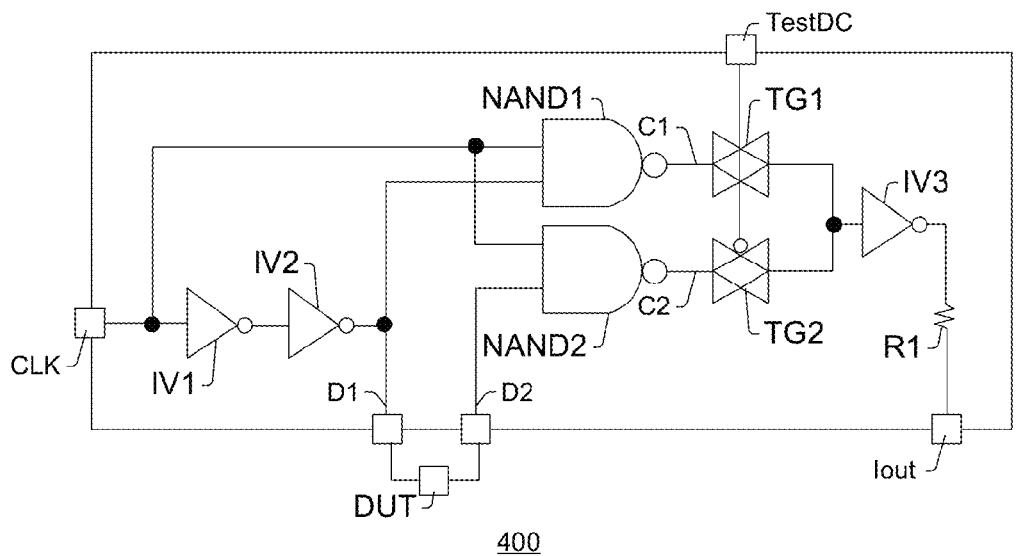
FIG. 4 illustrates an example of a time to current converter which can be used as a timing measurement circuit in some embodiments.

FIG. 4 depicts a more detailed embodiment of a time to current converter (TCC) circuit 400 in accordance with some embodiments. It should be clear that this embodiment circuit is but one illustrative circuit incorporating the embodiment methods, but does not limit the embodiments and does not limit the scope of the appended claims. The circuit 400 may be formed on an integrated circuit, such as a SoC, along with a device under test (DUT), such as a timing element 210 or timing delay path 214 previously illustrated in FIG. 2. TCC circuit 400 is used to determine the value of the timing delay between first and second input terminals D1, D2. A clock or known periodic signal is coupled to the input CLK terminal and then coupled to the input of the DUT through inverters IV1, IV2, and the signal CLK is also input to a logic gate NAND1. Because the inverters IV1, IV2 slightly delay the clock signal, the signals arriving at the inputs of the logic gate NAND1 are slightly offset or skewed relative to one another. Because of the NAND functionality, NAND1 will output a logic "0" when the signals at the both of its inputs are a logic "1", and will output a high voltage or logic "1" when either (or each) input is a "0". In this way, logic gate NAND1 detects when the two signals, the clock signal CLK, and the delayed signal D1 from the DUT device, overlap in time, and provides signal C1 accordingly.

A second logic gate NAND2 receives the CLK signal as well as the output of the DUT. As this gate is also a logic NAND gate, it will output a logic "0" or low voltage when both inputs are logic "1" or high voltage levels, it will output a high voltage or logic "1" when either (or each) input is a "0".

To perform a time to current operation, the TCC 400 makes two measurements. When the input Test DC is logic "1", a first transmission gate TG1 passes signal C1 to the input of third inverter IV3, which drives a corresponding current to Iout (labeled Iout1, which has a first width, w1, in FIG. 5). The input Test DC is then changed to logical "0", and a second transmission gate TG2 passes signal C2 to the input of the third inverter IV3, which drives a corresponding current to Iout (labeled as Iout2, which has a second width, w2, in FIG. 5). By storing values for Iout1 and Iout2, and then subtracting Iout2 from Iout1, the clock skew or timing delay value Td between D1 and D2 can be determined by analysis circuitry on the IC.

The example impedance R1 in the circuit 400 in FIG. 4 is a resistor. Resistors on board integrated circuits may be provided in a variety of ways, including but not limited to the use of diffusion resistors, polysilicon resistors, and the use of other materials that provide electrical conductivity with resistance. The physical value of the resistor R1 is not critical to the time to current measurement, only the average current measured in response to the logic circuitry output. Process dependent or temperature dependent device variations are also not critical, as they do not impact the time to current converter measurements. In alternative embodiments, other non-linear impedances may be used. RC and LC impedances may be used, for example.

Figure 5:
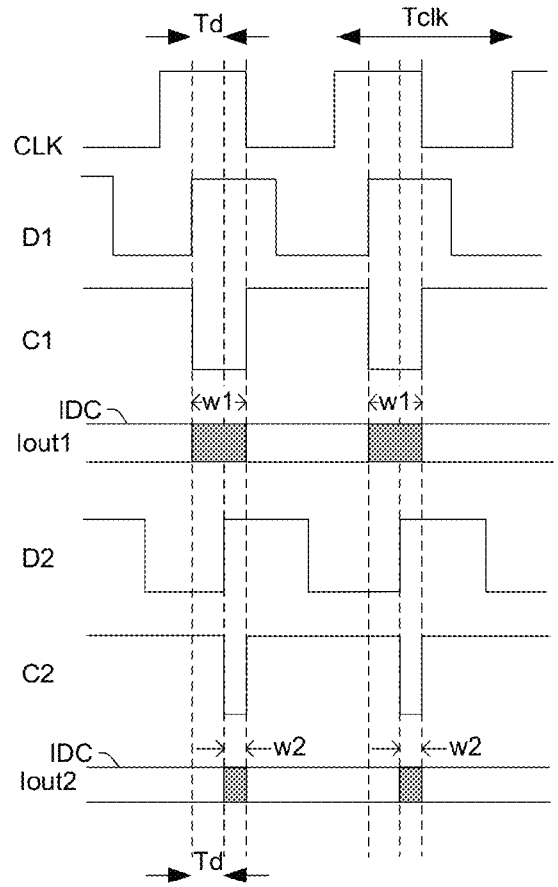
FIG. 5 illustrates a timing diagram illustrating an example of functionality consistent with FIG. 4's time-to-current converter.

FIG. 5 depicts in a timing diagram the waveforms illustrating the operation of the TCC circuit of FIG. 4. In FIG. 5, the clock signal CLK is a time varying periodic clock signal; here, a 50% duty cycle is used, although other duty cycles are also contemplated as falling within the scope of the present disclosure. The D1 input to NAND1 is delayed relative to the CLK signal, as evidenced by NAND1 output C1 and Iout1. Similarly, the D2 input to NAND2 is delayed by a different amount relative to the clock signal, wherein the skew or offset between D1 and D2 is indicated as Td.

D1 and D2 can be measured over many clock cycles, if desired, and then an average taken. By averaging the measurement over many cycles, slight errors are reduced or eliminated. Because the time Td is measured as a difference between D1 and D2, the actual value of the impedance, labeled R1 in the example embodiment, does not affect the measurement. Further, because the value of R1 is not critical, there is no need to calibrate or trim circuit elements to achieve an accurate measurement. The measurement is not affected by process or temperature dependent variations of the physical impedance.

Extending the embodiment to form alternative embodiments, a combination of logic gates other than the illustrated NAND gates may be used to extract the timing information (delay, frequency, duty cycle) present between two signals into current. The time to current converter circuit embodiment of FIG. 4 is simple to design and requires little silicon area to implement. No expensive counters, shift registers, or numerous matched delay buffer or delay line elements are needed. No lengthy calibrations are necessary before measurements are made. While an embodiment method for making a measurement using an external current meter is described above, as an alternative embodiment, an on chip current measurement circuit may be used. Use of the embodiments can provide a time delay measurement for complex integrated circuits where probing or other methods to test internal nodes is not practical or desirable.

According to some aspects, the disclosure provides an integrated circuit, comprising: a clock tree including a plurality of signal paths which stem from a clock source and each of which includes one or more delay elements that are subject to manufacturing variation. The integrated circuit also includes a timing measurement circuit having first and second inputs coupled to respective first and second predetermined locations on one or more of the signal paths. The timing measurement circuit is configured to provide timing delay value which is indicative of a timing delay of a clock signal as measured between the first and second predetermined locations and which is subject to the manufacturing variation.

Other embodiments relate to a methodology for integrated circuit design. In this methodology, a first electronic design file is provided for an integrated circuit having a timing measurement circuit thereon. Based on the first electronic design file, a plurality of integrated circuits (IC) are manufactured, wherein these ICs have respective timing measurement circuits arranged at predetermined locations on the respective ICs. The plurality of timing measurement circuits are used to measure a plurality of timing delay values, respectively, on the plurality of manufactured integrated circuits, respectively. The measured timing delay values are used to set how an auto-place and route tool arranges blocks in a second electronic design file, which is routed after the plurality of timing delays are measured, to account for measured manufacturing variation.

Still other embodiments relate to a time to current converter (TDC). The TDC includes first and second input terminals between which first and second signals whose edges exhibit a timing delay value are to be applied. The TDC also includes a clock input terminal on which a clock signal is to be received. First logic circuitry provides a first output current signal whose width represents an overlap between the clock signal and the first signal. Second logic circuitry provides a second output current signals whose width represents an overlap between the clock signal and the second signal. Analysis circuitry compares the first and second output current signals to determine the timing delay value between the edges of the first and second signals.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

What is claimed is:

1. An integrated circuit (IC), comprising:
a clock tree including a plurality of signal paths which stem from a clock source and each of which includes one or more delay elements that are subject to manufacturing variation, wherein the clock source is configured to operate independent of the one or more delay elements; and
a timing measurement circuit which is distinct from the one or more delay elements and which has first and second inputs coupled to respective first and second predetermined locations on one or more of the signal paths, wherein the timing measurement circuit is configured to provide a timing delay value which is indicative of a timing delay as measured between the first and second predetermined locations.

2. The IC of claim 1, further comprising:
a test probe output interface by which the timing measurement circuit is configured to provide the timing delay value to an external test probe device.

3. The IC of claim 1, wherein the timing measurement circuit is a time to digital converter.

4. The IC of claim 3, wherein the time to digital converter provides a multi-bit digital value corresponding to a first timing delay value as measured between the first and second inputs, wherein the multi-bit digital value can vary between a first digital value corresponding to a predetermined maximum timing delay value and a second, different digital value corresponding to a predetermined minimum timing delay value.

5. The IC of claim 1, wherein the timing measurement circuit is a time to current converter.

6. The IC of claim 5, wherein the time to current converter provides a current level value corresponding to a first timing delay value as measured between the first and second inputs, wherein the current level value can vary between a first current level value corresponding to a predetermined maximum timing delay value and a second current level value corresponding to a predetermined minimum timing delay value, and wherein the first current level value is different from the second current level value.

7. The IC of claim 6, wherein the time to current converter comprises:
   first and second input terminals between which first and second signals whose edges exhibit the first timing delay value are to be applied;
   a clock input terminal on which a clock signal is to be received;
   first logic circuitry to provide a first output current signal whose width represents an overlap between the clock signal and the first signal; and
   second logic circuitry to provide a second output current signal whose width represents an overlap between the clock signal and the second signal; and wherein the IC further comprises:
   analysis circuitry to determine the first timing delay value between the edges of the first and second signals by comparing the first and second output current signals.

8. The IC of claim 7, wherein the time to current converter further comprises:
   a test signal terminal on which a test signal is to be provided;
   wherein when the test signal is in a first state the first output current signal is present at an output terminal of the time to current converter and the second output current signal is blocked from the output terminal; and
   wherein when the test signal is in a second state the second output current signal is present at the output terminal of the time to current converter and the first output current signal is blocked from the output terminal.

9. The IC according to claim 7, wherein the first and second logic circuitry provide the first and second output current signals concurrently, and wherein the clock signal is independent of the first and second signals.

10. The IC of claim 1, further comprising:
    a control circuit configured to enable the timing measurement circuit during a test mode when the clock source is enabled and further configured to disable the timing measurement circuit in a low-power mode.

11. A methodology for integrated circuit design, comprising:
    providing a first electronic design file for an integrated circuit comprising a timing measurement circuit and a signal path made up of delay elements, wherein the timing measurement circuit has first and second inputs coupled to first and second predetermined locations, respectively, on the signal path, and wherein the timing measurement circuit is distinct from the delay elements of the signal path;
    based on the first electronic design file, manufacturing a plurality of integrated circuits having respective timing measurement circuits arranged at predetermined locations on the respective integrated circuits;
    using the plurality of timing measurement circuits to measure a plurality of timing delay values, respectively, on the plurality of manufactured integrated circuits, respectively; and
    using the measured timing delay values to set how an auto-place and route tool arranges blocks in a second electronic design file, which is routed after the plurality of timing delays are measured, to account for measured manufacturing variation.

12. The methodology of claim 11, wherein a timing delay value is measured between first and second signals on an integrated circuit, and wherein measuring the timing delay value comprises:
    identifying a timing delay between a first edge of the first signal and a second edge of the second signal; and
    providing a multi-bit digital value corresponding to the timing delay value.

13. The methodology of claim 12, wherein the first edge and the second edge are both rising edges or are both falling edges.

14. The methodology of claim 12, wherein the multi-bit digital value can vary between a first digital value corresponding to a predetermined maximum timing delay value and a second, different digital value corresponding to a predetermined minimum timing delay value.

15. The methodology of claim 11, wherein a timing delay value is measured between first and second signals on an integrated circuit, and wherein measuring the timing delay value comprises:
    identifying a timing delay between a first edge of the first signal and a second edge of the second signal; and
    providing a current signal having a current level which corresponds to the timing delay value.

16. The methodology of claim 11, further comprising:
    providing the first electronic design file further comprising a second timing measurement circuit and a second signal path made up of second delay elements, wherein the second timing measurement circuit has third and fourth inputs coupled to third and fourth predetermined locations, respectively, on the second signal path, and wherein the signal path and the second signal path originate from a common clock source.

17. A time to current converter, comprising:
    first and second input terminals between which first and second signals whose edges exhibit a timing delay value are to be applied;
    a clock input terminal on which a clock signal is to be received;
    first logic circuitry to provide a first output current signal whose width represents an overlap between the clock signal and the first signal;
    second logic circuitry to provide a second output current signal whose width represents an overlap between the clock signal and the second signal; and
    analysis circuitry to compare the first and second output current signals to determine the timing delay value between the edges of the first and second signals.

18. The time to current converter of claim 17, further comprising:
    a test signal terminal on which a test signal is to be provided;
    wherein when the test signal is in a first state the first output current signal is present at an output terminal of the time to current converter and the second output current signal is blocked from the output terminal; and
    wherein when the test signal is in a second state the second output current signal is present at the output terminal of the time to current converter and the first output current signal is blocked from the output terminal.

19. The time to current converter of claim 18, where the first logic circuitry comprises a first NAND gate having an output tied to a first transmission gate, a conductance of the first transmission gate being controlled by the test signal, and where the second logic circuitry comprises a second NAND gate independent of the first NAND gate and having an output tied to a second transmission gate, a conductance of the second transmission gate being controlled by the test signal.

20. The time to current converter of claim 17, wherein the first and second logic circuitry provide the first and second output current signals concurrently.

* * * * *